(12) United States Patent
Zhu

(10) Patent No.: US 9,155,216 B2
(45) Date of Patent: Oct. 6, 2015

(54) INTERFACE CARD MODULE AND ELECTRONIC DEVICE HAVING THE SAME

(71) Applicant: Wistron Corporation, New Taipei (TW)

(72) Inventor: Chong-Xing Zhu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 312 days.

(21) Appl. No.: 13/936,229

(22) Filed: Jul. 8, 2013

(65) Prior Publication Data

US 2014/0049901 A1    Feb. 20, 2014

(30) Foreign Application Priority Data

Aug. 17, 2012   (CN) .......................... 2012 1 0295637

(51) Int. Cl.
*H05K 7/20* (2006.01)
*H05K 7/14* (2006.01)
*G06F 1/18* (2006.01)

(52) U.S. Cl.
CPC .............. *H05K 7/1418* (2013.01); *G06F 1/185* (2013.01); *H05K 7/1487* (2013.01)

(58) Field of Classification Search
CPC .................................. G06F 1/185; G06F 1/186
USPC ........................................................ 361/759
See application file for complete search history.

(56) References Cited

U.S. PATENT DOCUMENTS

| | | | |
|---|---|---|---|
| 5,490,038 A * | 2/1996 | Scholder et al. | 361/759 |
| 5,544,006 A * | 8/1996 | Radloff et al. | 361/679.32 |
| 6,373,691 B1 * | 4/2002 | Chen | 361/679.32 |
| 7,283,376 B2 * | 10/2007 | Han et al. | 361/801 |
| 7,499,271 B2 * | 3/2009 | Wagatsuma et al. | 361/679.33 |
| 7,826,211 B2 * | 11/2010 | Liu | 361/679.4 |
| 8,848,377 B2 * | 9/2014 | Lu et al. | 361/726 |
| 8,982,551 B2 * | 3/2015 | Zhou | 361/679.37 |
| 2005/0265005 A1 * | 12/2005 | Han et al. | 361/726 |
| 2009/0027843 A1 * | 1/2009 | Roesner | 361/683 |
| 2009/0067142 A1 * | 3/2009 | Tsai et al. | 361/759 |
| 2012/0293946 A1 * | 11/2012 | Zheng | 361/679.33 |
| 2014/0185247 A1 * | 7/2014 | Dittus et al. | 361/728 |

FOREIGN PATENT DOCUMENTS

| | | |
|---|---|---|
| TW | M249072 | 11/2004 |
| TW | M428465 | 5/2012 |

OTHER PUBLICATIONS

Office action mailed on Sep. 19, 2014 for the Taiwan application No. 101131518, filing date: Aug. 30, 2012, p. 1 line 11-14, p. 2-3 and p. 4 line 1 and line 5-7.

* cited by examiner

*Primary Examiner* — Anthony Q Edwards
(74) *Attorney, Agent, or Firm* — Winston Hsu; Scott Margo

(57) ABSTRACT

In a support frame of an interface card module, two module locks are disposed thereon, both the support frame and the module locks having enlarged operational holes for easy operation for a user. To install the interface card module on a housing of an electronic device, the module locks are pushed and moved by the housing and withstood by the housing. The user may directly operate the module locks through the enlarged holes to disengage the module locks from the housing and to uninstall the interface card module. The interface card module further uses a card lock pivoted on the support frame for locking the interface card at the support frame.

22 Claims, 9 Drawing Sheets

INTERFACE CARD MODULE AND ELECTRONIC DEVICE HAVING THE SAME

BACKGROUND OF THE INVENTION

1. Field of the Invention

The invention relates to an interface card module and an electronic device having the interface card module, and more particularly, to an interface card module and an electronic device having the same that facilitates easy installation in consideration of ergonomics.

2. Description of the Prior Art

Newly developed server structures like the cloud server structure in the form of 2U4 nodes contain mainstructure with ½U for each node. With the highly compacted disposition within each node, various kinds of interface cards, such as interface cards with PCI or AGP interface, are commonly used in the node for functional expansion. These interface cards configuration may also be used as an expansion carrier of GPU, Raid, etc. Practically, each interface card should be assembled with a dedicated support frame to make an interface card module, which is then installed on the server.

However, there is no clear operational guide for helping a user to quickly and easily install such interface card modules on the server or remove them from the server. Users may not be able to start from exactly a right position to install or remove the interface card module. In addition, most interface card modules provide no easy-to-handle structure.

SUMMARY OF THE INVENTION

To solve the aforementioned problem so that a user may have easy experience to quickly install/remove the interface card module through the designed mechanism of the interface card module, the invention provides an interface card module from ergonomic concern.

An embodiment of the invention provides an interface card module, wherein an interface card is mounted thereon. The interface card module includes a support frame, a riser card, and two module locks. The support frame includes two first holes. The support frame is adapted for being mounted on a housing of an electronic device. The riser card is mounted on the support frame and includes a slot wherein the interface card is installed thereon. The two module locks are moveably mounted on the support frame corresponding to the positions of the two first holes. The two module locks are adapted for being withstood by the housing of the electronic device for engaging the support frame on the housing and installing the interface card module on the electronic device. The two module locks are operatable through the two first holes so as to move relative to the support frame to disengage from the withstanding of the housing of the electronic device.

Another embodiment of the invention provides an electronic device. The electronic device includes a housing, an interface card module, and an interface card. The interface card module includes a support frame, a riser card, and two module locks. The support frame includes two first holes. The support frame is adapted for being mounted on the housing. The riser card is mounted on the support frame and includes a slot. The two module locks are moveably mounted on the support frame corresponding to the positions of the two first holes. The two module locks are adapted for being withstood by the housing for engaging the support frame on the housing and installing the interface card module on the housing. The two module locks are operatable through the two first holes so as to move relative to the support frame to disengage from the withstanding of the housing. The interface card is adapted to be installed into the slot of the riser card.

With the interface card module and the electronic device having such interface card module provided by the invention, the support frame of the interface card module has a plurality of module locks disposed thereon. Both the support frame and the module locks have enlarged operational holes for easy operation for a user. As the interface card module is to be installed on the housing of the electronic device, the module locks will be pushed and moved by the housing and then withstood by the housing. The user may directly operate the module locks through the enlarged holes to disengage the module locks from the housing and to uninstall the interface card module. The interface card module further uses a card lock pivoted on the support frame adapted for locking the interface card at the support frame. Without the need of additional tools, users are able to use a direct and easy way to fast install and uninstall the interface card.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
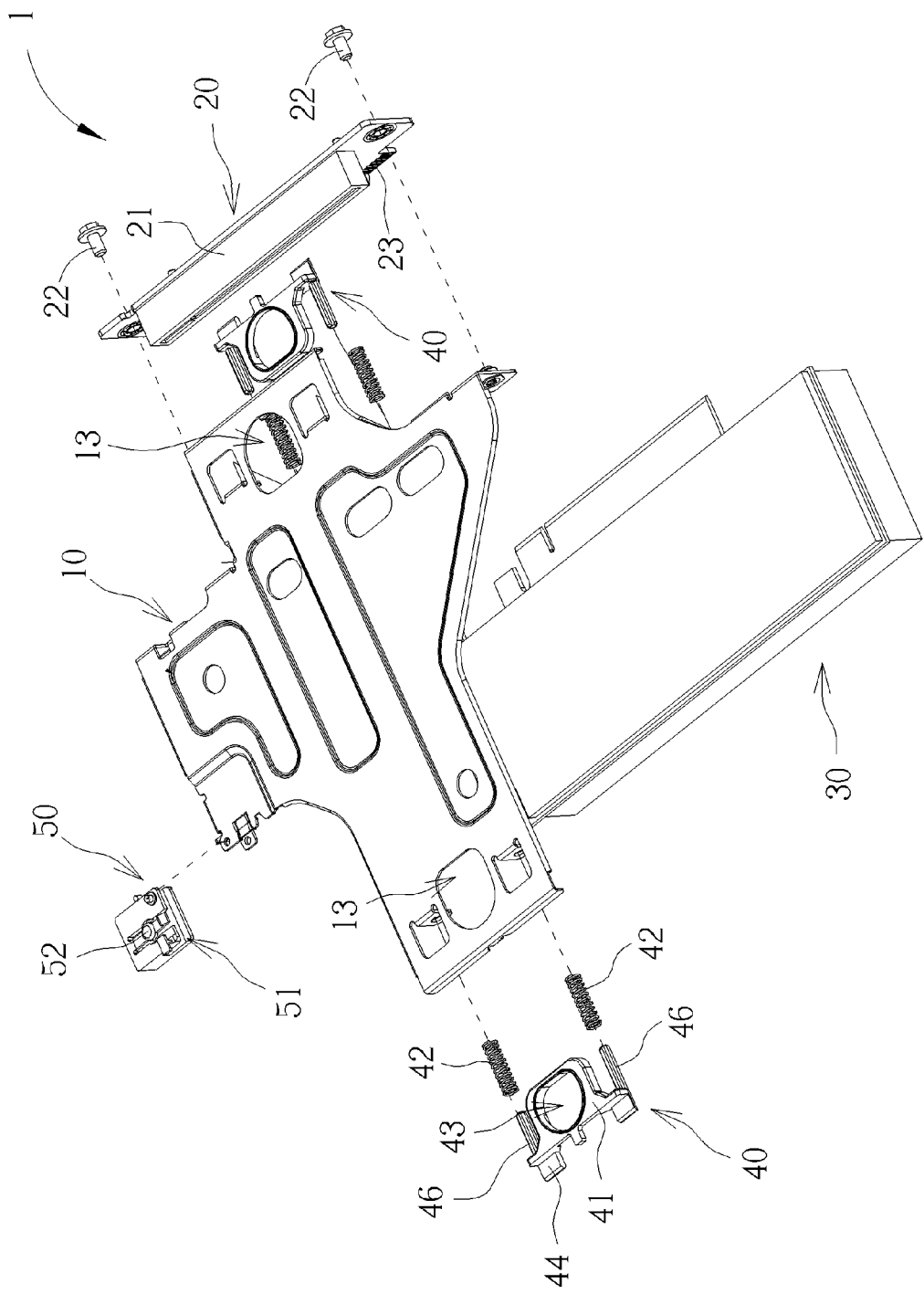
FIG. 1 is an illustration showing an exploded view of components of an interface card module according to an embodiment of the invention.
Figure 2:
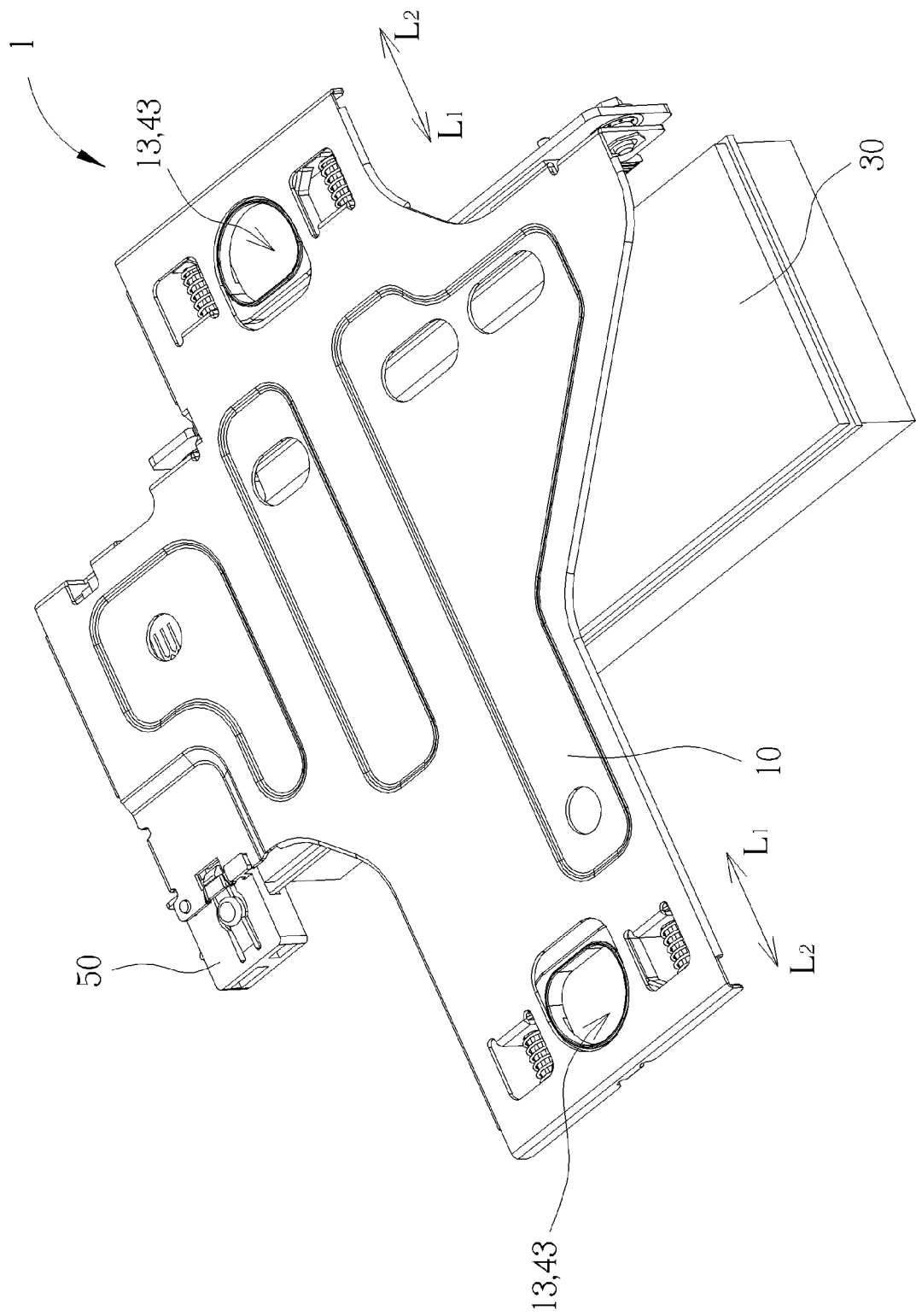
FIG. 2 is an illustration of the assembled interface card module.

Please refer to FIG. 1 and FIG. 2. FIG. 1 is an illustration showing an exploded view of components of an interface card module according to an embodiment of the invention and FIG. 2 is an illustration of the assembled interface card module. The interface card module 1 includes a support frame 10, a riser card 20, and a plurality of module locks 40. The riser card 20 may be, as shown in FIG. 1, mounted and fixed to the support frame 10 via screws or by other ways such as coupling. The riser card 20 has a slot 21 adapted for receiving an interface card 30. The perpendicular relation of position between the slot 21 and a connector 23 of the riser card 20 offers a parallel installation of the interface card 30 with respect to a motherboard of the electronic device, thereby reducing room taken by the interface card 30, as the interface card module 1, which carries the interface card 30, is installed to a corresponding slot of the electronic device through its connector 23 of the riser card 20. It is, however, only one of the embodiments to adapt the interface card 30 and the riser card 20 to the interface card module 1 and should not form a limitation to the invention.

In one embodiment of the invention, the interface card module 1 has two module locks 40, each disposed at a side of the support frame 10. In other words, to provide a much easy ergonomic experience for a user to handle the installation and removal of the interface card module 1, the two module locks 40 facilitate direct and simple single-handed operation of the user, through his/her thumb and another finger like the index finger, the middle finger, or the ring finger. The support frame 10 has two first holes 13 for the user to reach his/her fingers, whereas the two module locks 40 are mounted at the positions of the support frame 10 corresponding to the two first holes 13. Each module lock 40 includes a lock body 41 and two elastic elements 42. A second hole 43 is also included on the lock body 41 and when the module lock 40 is mounted on the support frame 10, the second hole 43 of the lock body 41 aligns and corresponds to the position where the first hole 13 is located, as shown in FIG. 2.

The lock body 41 further includes a guiding rod 46, or two guiding rods 46 to balance the movement of the lock body 41. Each of the elastic elements 42, a spiral spring for example, is disposed between one of the guiding rods 46 and the support frame 10. The guiding rods 46 and the elastic elements 42 facilitate the slight movement of the module locks 40 relative to the support frame 10, which as shown in FIG. 2 for example, the module locks 40 moves relative to the support frame 10 along a direction $L_1L_2$. As previously described, when the module locks 40 are mounted on the support frame 10, the second holes 43 of the lock body 41 align and correspond to the position where the first holes 13 are located. The size of the first holes 13 and the second holes 43 are at least as large as the fingers of the user can pass so that both module locks 40 may provide the user with single-handed operation. Each of the fingers of the user passes through the first hole 13 and the second hole 43 to push the module lock 40 to move relative to the support frame 10 along the direction $L_1$ as shown in FIG. 2. Such movement also leads to the engagement and release between the module locks 40 and the housing of the electronic device, which will be described in detail in the following paragraphs.

As each module lock 40 is pushed to move along direction $L_1$ shown in FIG. 2 on the support frame 10, the elastic element 42 disposed between the guiding rod 46 and the support frame 10 is also compressed by the lock body 41 and stores an elastic restoring force. The elastic element 42 shown in the figure as a compression spring may also be implemented with a stretch spring or of other types of elastic elements in other embodiments of the invention. As the module lock 40 is no longer pushed (by the finger), the restoring force of the elastic element 42 moves each module lock 40 on the support frame 10 along direction $L_2$ back to the original position, and more specifically, the lock body 41 of the module lock 40 will be withstood by the support frame 10.

Additionally, since the first holes 13 and the second holes 43 are provided as open holes with large size, users may easily notice the parts to operate the interface card module 1. Bright and distinct color may also be added around the first holes 13 for further notice.

Figure 3:
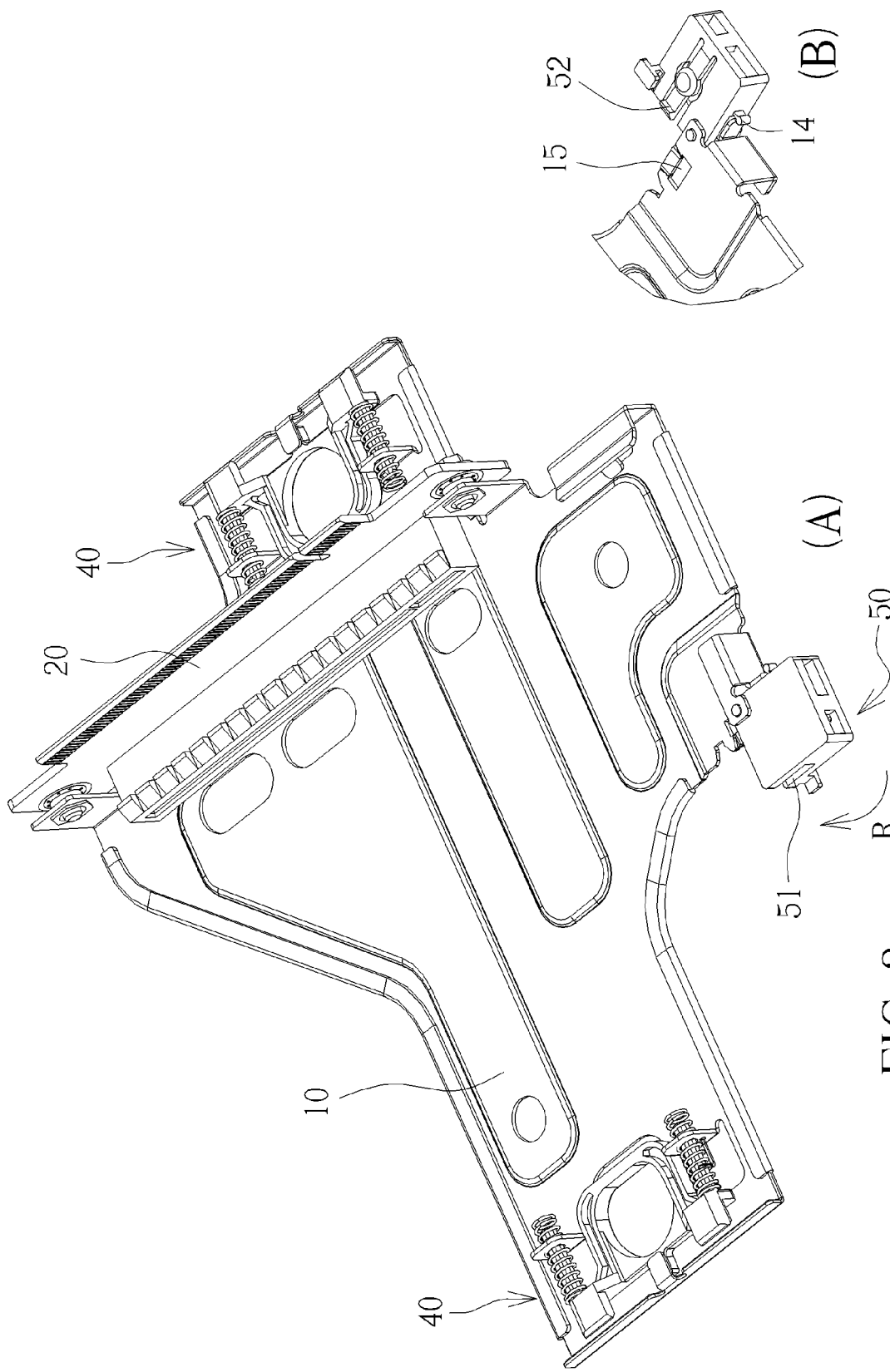
FIG. 3 is an illustration showing a card lock mounted on the support frame at a release position.

Please refer to FIG. 3, which is an illustration showing a card lock 50 mounted on the support frame 10 at a release position. The interface card module 1 further includes the card lock 50 which is pivoted to the support frame 10 and can be rotated to a release position with respect to the support frame 10 as shown in FIG. 3, or rotated along direction R with respect to the support frame 10 to a locking position (referring to FIG. 4), in which the release position and the locking position may be located on the support frame 10 at a 90 degree with each other. The card lock 50 is adapted for retaining the interface card 30 and keeping the interface card 30 from detaching off the support frame 10. As shown in FIG. 3, the support frame 10 has a wall 14 located at a pivot route of the card lock 50 that rotates with respect to the support frame 10. As the card lock 50 rotates on the support frame 10, the wall 14 is adapted for retaining the card lock 50, keeping the card lock 50 from over rotation, and maintaining the card lock 50 at the release position.

Figure 4:
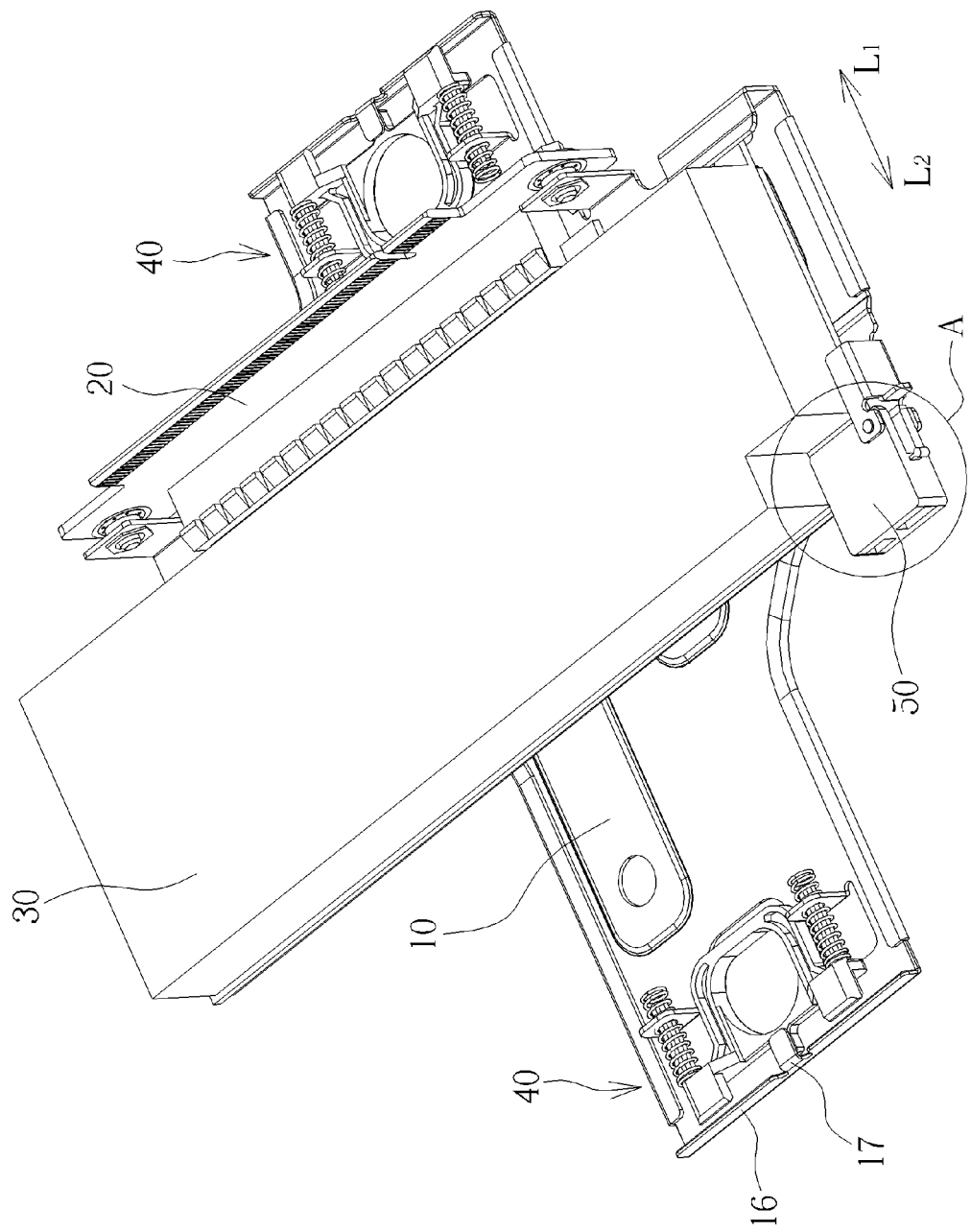
FIG. 4 is an illustration showing the interface card installed on the support frame and retained by the card lock.

Please refer to FIG. 4, which is an illustration showing the interface card 30 installed on the support frame 10 and retained by the card lock 50. Please also refer to FIG. 3. The card lock 50 includes a fastening groove 51. After the interface card 30 is inserted along direction $L_1$ and is installed on the slot 21 of the riser card 20, the card lock 50 may be pivoted with respect to the support frame 10 to the locking position as shown in FIG. 4, at which position the interface card 30, or a corner of the PCB of the interface card 30, extends into the fastening groove 51 and is retained by the card lock 50. In such way, the pivoting of the card lock 50 to the locking position with respect to the support frame 10 effectively restrains the freedom of movement of the interface card 30 along direction $L_2$, keeping out the possibility that the interface card 30 may have fallen off or rotated with respect to the riser card 20 that produces bad contact with the riser card 20.

Please refer to FIG. 3. In FIG. 3 part (B), which shows a different angle of view of what is illustrated in FIG. 3 part (A), the card lock 50 further includes an elastic hook 52, whereas the support frame 10 includes an opening 15 located at the pivot route of the card lock 50. When the card lock 50 rotates to the locking position with respect to the support frame 10 to retain the interface card 30, the elastic hook 52 engages with the opening 15 so that the card lock 50 may be retained at the locking position with its pivoting movement restrained. Simply pressing the elastic hook 52 will disengage the elastic hook 52 from the opening 15 to release the card lock 50.

Figure 5:
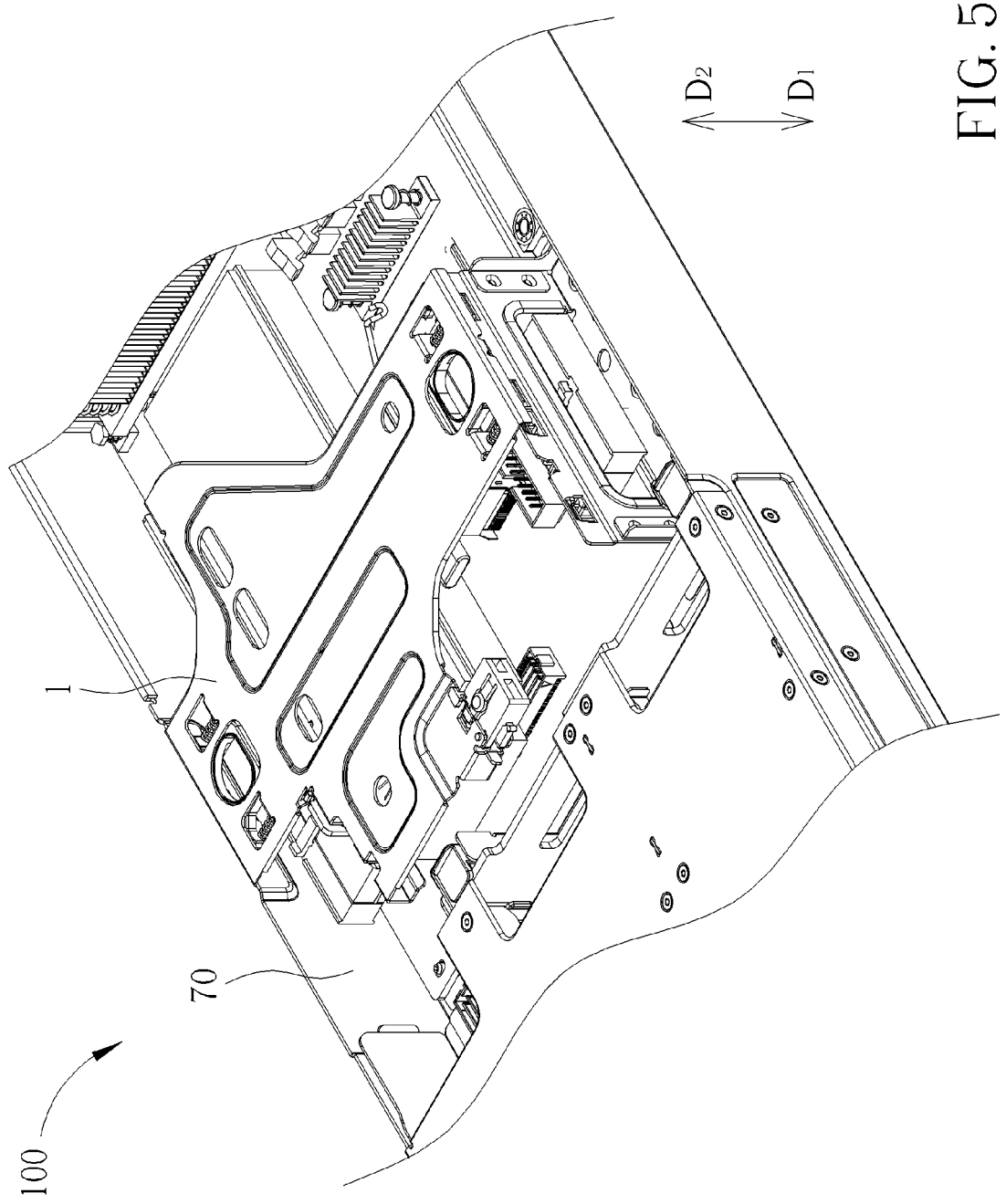
FIG. 5 is an illustration of an electronic device and the interface card module.

Please refer to FIG. 5, which is an illustration of an electronic device 100 and the interface card module 1. As described in the previous paragraphs, when the interface card module 1 goes along direction $D_1$ to be installed on the electronic device 100, the connector 23 of the riser card 20 will be installed on a corresponding slot of the electronic device 100, the slot being blocked by the interface card module 1 and therefore is not illustrated in FIG. 5. The support frame 10 of the interface card module 1 is then mounted on a housing 70 of the electronic device 100 to install the interface card module 1, and the interface card 30 preinstalled on the interface card module 1, on the electronic device 100.

Figure 6:
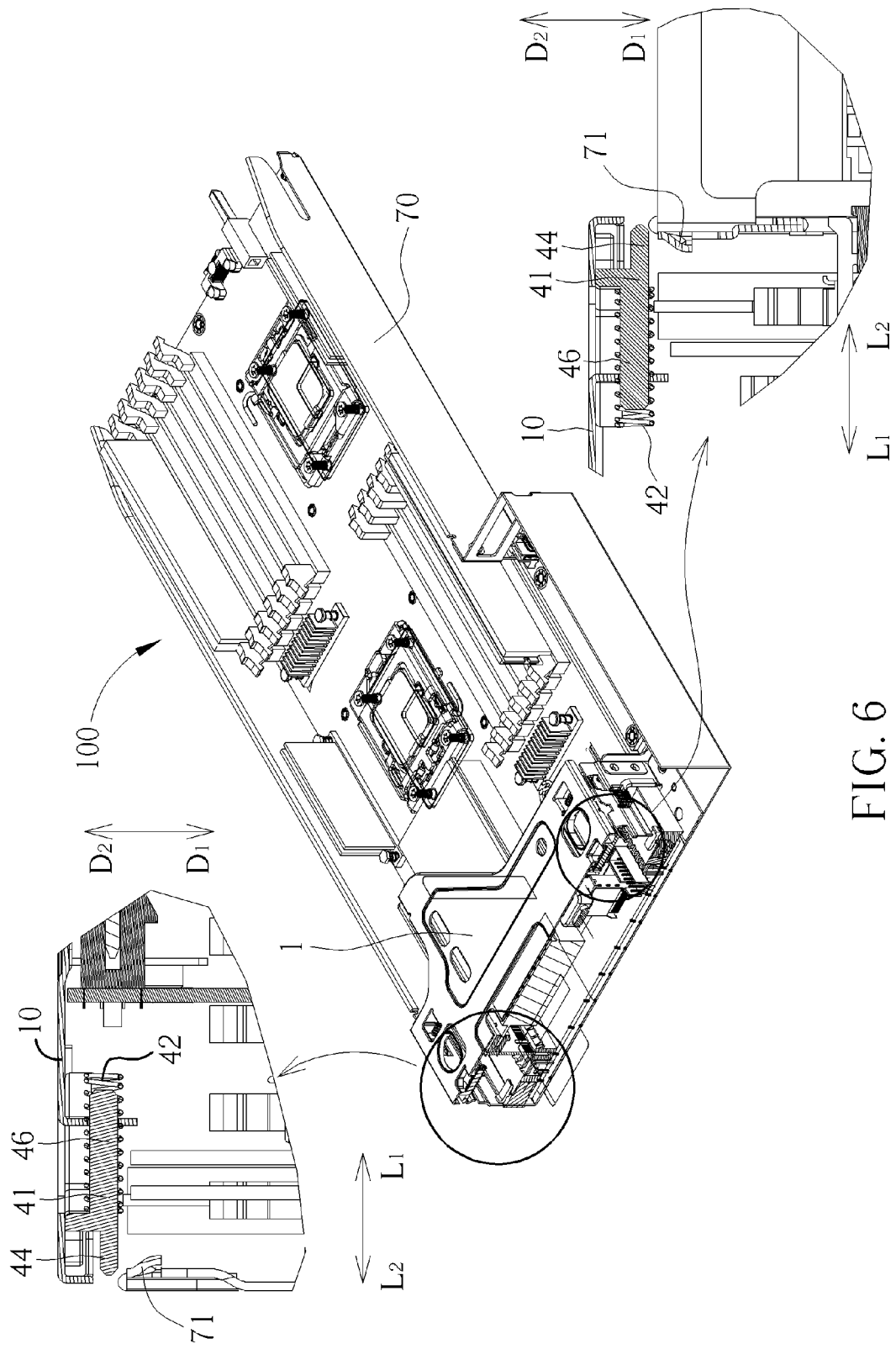
FIG. 6 is an illustration showing a relative position between the interface card module about to be installed on the housing and yet to have contact with the housing.
Figure 7:
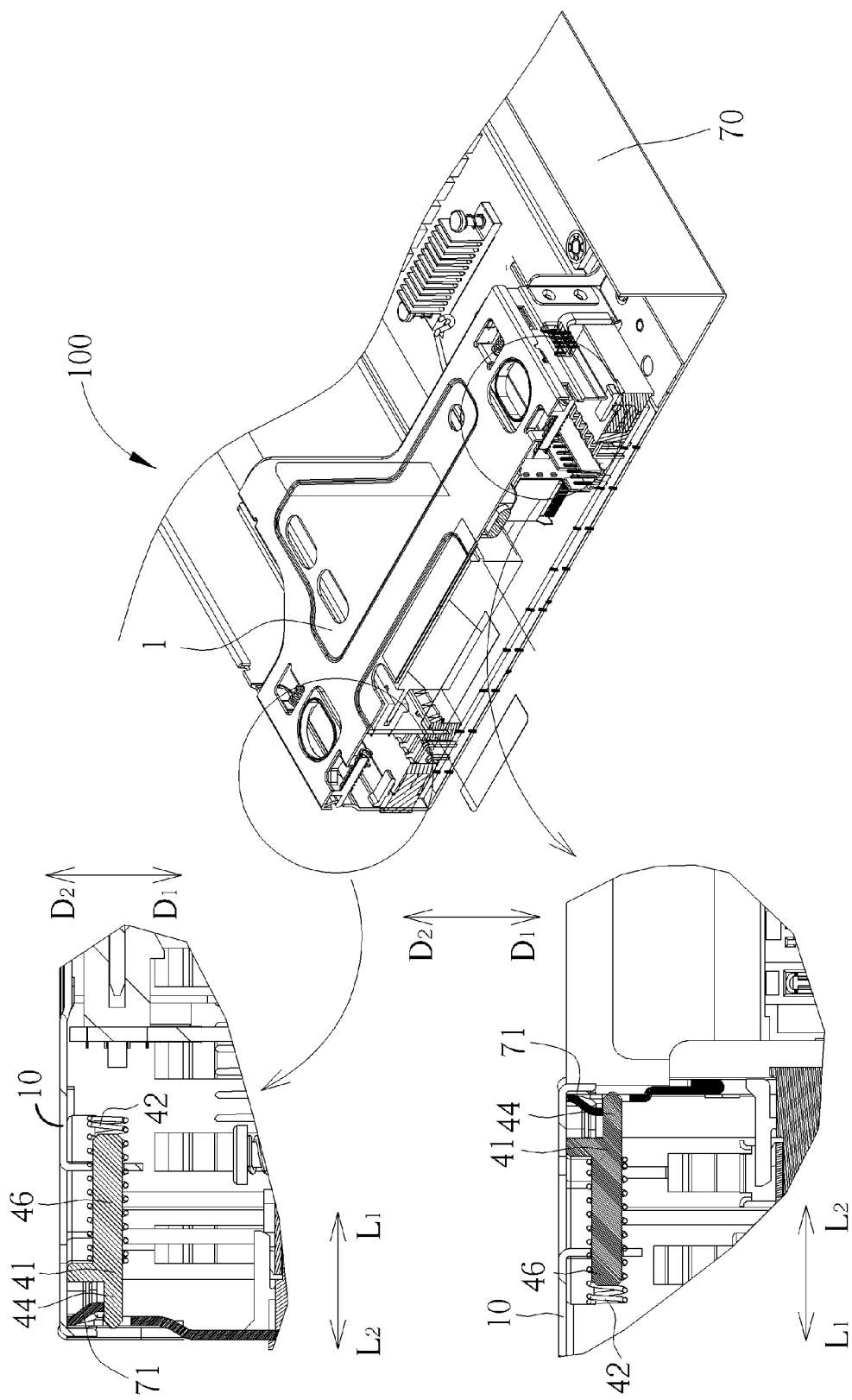
FIG. 7 is an illustration showing a relative position between the interface card module and the housing.

Please refer to FIG. 6 and FIG. 7. FIG. 6 is an illustration showing a relative position between the interface card module 1 about to be installed along direction $D_1$ on the housing 70 and yet to have contact with the housing 70, and FIG. 7 is an illustration showing a relative position between the interface card module 1 and the housing 70 where the interface card module 1 is installed thereon along direction $D_1$. Two enlarged partial diagrams at the sides of both FIG. 6 and FIG. 7 show the sectional view of the two module locks 40 and the housing 70.

In the embodiments of the invention, the housing 70 of the electronic device 100 provides a protrusion 71 at each of the two sides where the interface card module 1 is going to be mounted, and as illustrated in FIG. 1, the lock body 41 of each of the module locks 40 at both sides has an engaging part 44, each extending outward along direction $L_2$. In FIG. 6, during the process of the interface card module 1 being installed along direction $D_1$ on the housing 70, the engaging parts 44 of the lock bodies 41 of the module locks 40 at both sides will be abutted and pushed by the protrusions 71 of the housing 70 of the electronic device 100, thereby the module locks 70 may be moved relative to the support frame 10 along direction $L_1$ and meanwhile the elastic elements 42 are compressed. In FIG. 7, as the interface card module 1 keeps moving downward along direction $D_1$, the engaging parts 44 are no longer pushed by the protrusions 71 and the module locks 40 will be pushed by the compressed elastic elements 42, moving toward direction $L_2$ and bringing the engaging parts 44 beneath the protrusions 71 and withstood by the protrusions 71. In other words, as the interface card module 1 is installed on the housing 70, the protrusions 71 of the housing 70 withstand the engaging parts 44 of the module locks 40 of the interface card module 1 so that the freedom of movement of the interface card module 1 along direction $D_2$ is restricted. The interface card module 1 may be tightly fixed to the housing 70 and does not fall off upward.

Figure 9:
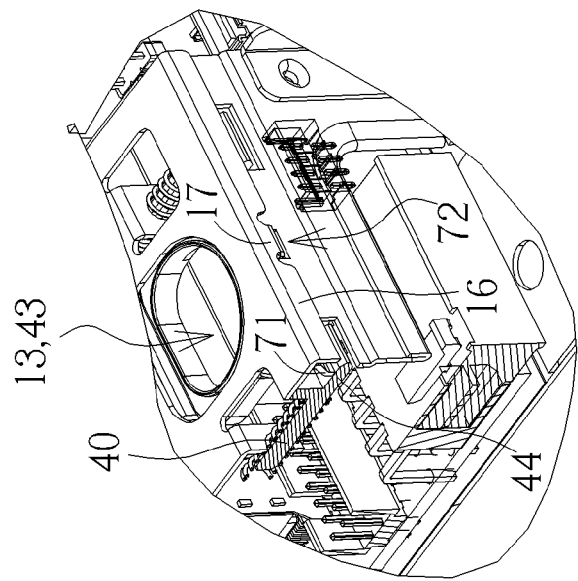
FIG. 8 and FIG. 9 are illustrations showing two sides of the support frame of the interface card module, the engagement of the module locks and the housing after the interface card module is installed on the housing of the electronic device.
Figure 8:
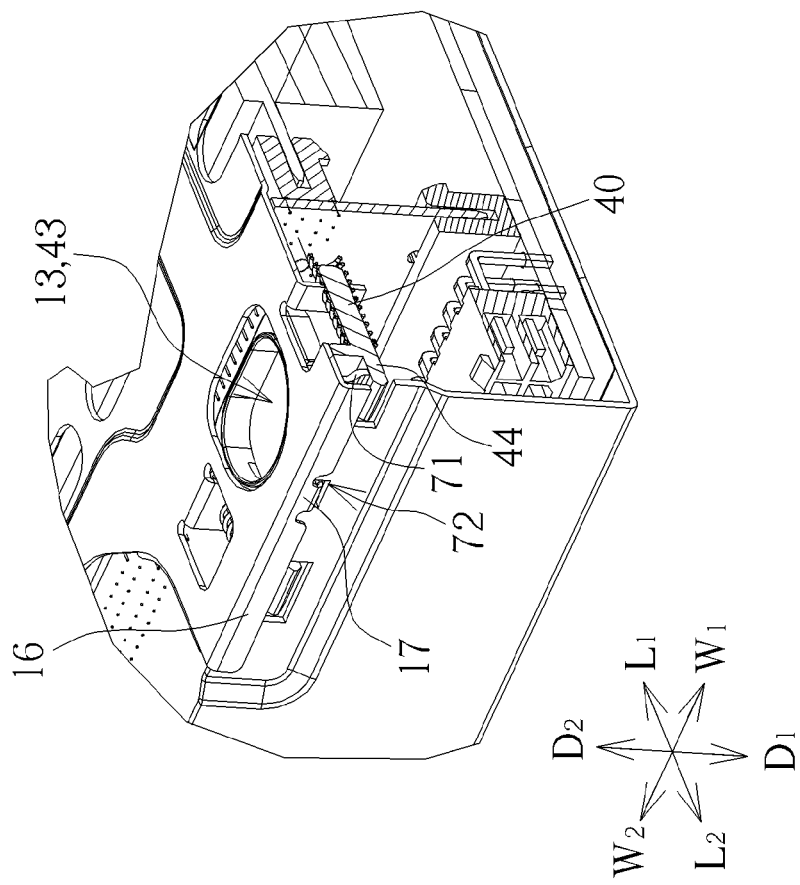

Please refer to FIG. 8 and FIG. 9, which are illustrations showing two sides of the support frame 10 of the interface card module 1, the engagement of the module locks 40 and the housing 70 after the interface card module is installed on the housing 70 of the electronic device 100. The support frame 10 further includes a first bending part 16 and a second bending part 17, both at each side of the support frame 10 (also referring to FIG. 4). When the interface card module 1 is finished installing on the housing 70, the first bending parts 16 are located outside the housing 70 and extend along direction $D_1$, so as to restrict the movement of the interface card module 1 along direction $L_1L_2$. The housing 70 also has a restraining slot 72 corresponding to the position where the second bending part 17 is located, and when the interface card module 1 is finished installing on the housing 70, the second bending parts 17 are also located outside the housing 70 and extend along direction $L_1$ right into the restraining slot 72, wherein the widths of the restraining slot 72 and the second bending part 17 are substantially the same, so as to restrict the movement of the interface card module 1 along direction $W_1W_2$.

Besides the displacement restriction provided to the interface card module 1 by the housing 70, the module locks 40 and the support frame 10 of the interface card module 1 may also serve to restrict the rotational freedom of the interface card module 1 after installed on the housing 70, i.e., the engaging parts 44 of the module locks 40 restrict the rotational freedom of the interface card module 1 both along the axis of direction $L_1L_2$ and the axis of direction $W_1W_2$, whereas the first bending parts 16 of the support frame 10 further restrict the rotational freedom of the interface card module 1 along the axis of direction $D_1D_2$.

Figure 10:
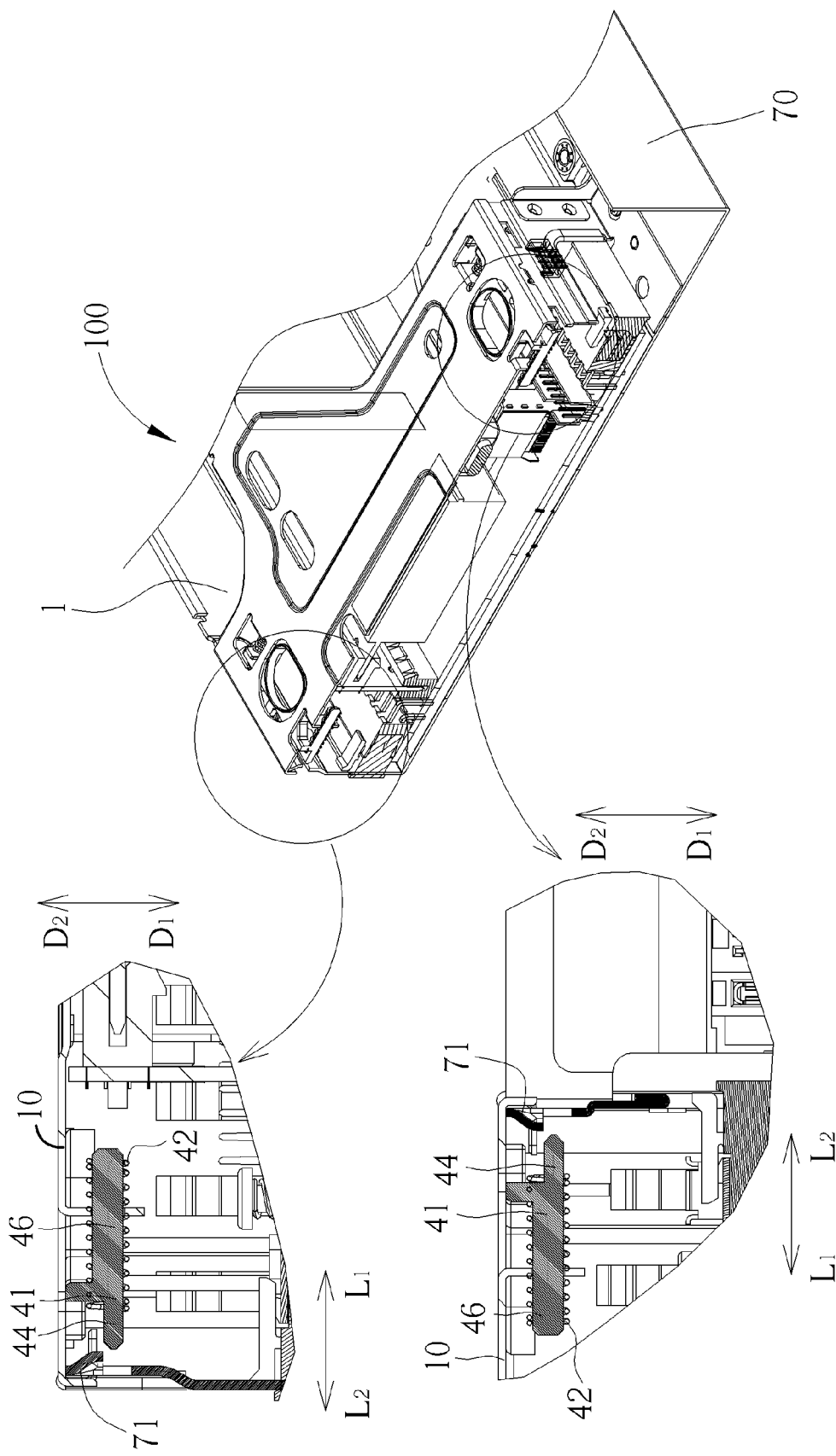
FIG. 10 is an illustration of the process of uninstalling the interface card module 1 from the housing of the electronic device.

Please refer to FIG. 10, which is an illustration of the process of uninstalling the interface card module 1 from the housing 70 of the electronic device 100. Previously in FIG. 6 and FIG. 7, an installing process of the interface card module 1 is described and illustrated. To remove/uninstall the interface card module 1 from the housing 70, simply operating the two module locks 40 through the first holes 13 can move the module locks 40 relative to the support frame 10 and disengage the module locks 40 from the withstanding of the housing 70 of the electronic device 100. More specifically, the module locks 40 are to be pushed, through the first holes 13 and the second holes 43 at both sides, to move along direction $L_1$ relative to the support frame 10 all the way until the engaging parts of the module locks 40 at both sides are no longer withstood by the protrusions 71 of the housing 70. At such state, the freedom of movement of the interface card module 1 along direction $D_2$ is no longer restricted by the housing 70 and the interface card module 1 can be removed from the housing 70 along direction $D_2$.

It should be noted that in each figure referred in the application, the direction $D_1D_2$ may be regarded as a first direction, the direction $L_1L_2$ as a second direction, and the direction $W_1W_2$ as a third direction, which are perpendicular to one another, or can be regarded as directions along the Z-axis, the X-axis, and the Y-axis of a space coordinate system respectively.

In summary, the interface card module and the electronic device having such module provided in the embodiments of the invention dispose two module locks on the support frame of the interface card module, and both the support frame and the module locks have enlarged operational holes for easy operation for a user. To install the interface card module on the housing of the electronic device, the module locks are pushed and moved by the housing and then withstood by the housing. The user may directly operate the module locks through the enlarged holes to disengage the module locks from the housing and to uninstall the interface card module. The interface card module further uses the card lock pivoted on the support frame for locking the interface card at the support frame.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interface card module, wherein an interface card is mounted thereon, the interface card module comprising:
   a support frame comprising two first holes, the support frame adapted for being mounted on a housing of an electronic device;
   a riser card mounted on the support frame and comprising a slot wherein the interface card is installed thereon; and
   two module locks moveably mounted on positions of the support frame corresponding to the two first holes, the two module locks adapted for being withstood by the housing of the electronic device for engaging the support frame on the housing and installing the interface card module on the electronic device, the two module locks operatable through the two first holes so as to move relative to the support frame to disengage from the withstanding of the housing of the electronic device.

2. The interface card module of claim 1, further comprising a card lock mounted on the support frame and pivotable to a locking position or a release position with respect to the support frame.

3. The interface card module of claim 2, wherein the card lock comprises a fastening groove in which the interface card extends and is retained therein when the card lock is pivoted to the locking position with respect to the support frame.

4. The interface card module of claim 3, wherein the card lock comprises an elastic hook and the support frame comprises an opening at a pivot route of the card lock and wherein the elastic hook is adapted to engage with the opening for restraining pivoting of the card lock as the card lock is pivoted to the locking position with respect to the support frame.

5. The interface card module of claim 2, wherein the support frame comprises a wall located at a pivot route of the card lock on the support frame and adapted for retaining the card lock at the release position.

6. The interface card module of claim 1, wherein each module lock comprises a lock body comprising a second hole corresponding to the first hole of the support frame.

7. The interface card module of claim 6, wherein the lock body further comprises a guiding rod, each module lock further comprising an elastic element disposed between the guiding rod of the lock body and the support frame and adapted to be compressed by the lock body and have a restoring force when the module lock moves relative to the support frame.

8. The interface card module of claim 6, wherein the lock body further comprises an engaging part and the housing of the electronic device comprises a protrusion adapted for pushing the engaging part and moving the module lock relative to the support frame.

9. The interface card module of claim 1, wherein the interface card module is adapted to be installed on the electronic device along a first direction and the two module locks are adapted to be pushed to move toward a second direction by the housing of the electronic device and withstood by the housing when the interface card module is installed on the electronic device such that the movement of the interface card module along the first direction is restricted.

10. The interface card module of claim 9, wherein the lock body further comprises an engaging part and the housing of the electronic device comprises a protrusion adapted for pushing the engaging part and moving the module lock relative to the support frame along the second direction, and when the interface card module is installed on the electronic device, the protrusion withstands the engaging part such that the movement of the interface card module along the first direction is restricted.

11. The interface card module of claim 9, wherein the support frame further comprises a first bending part and a second bending part, the housing further comprises a restraining slot corresponding to the second bending part, and when the interface card module is installed on the electronic device, the first bending part extends along the first direction and the second bending part extends into the restraining slot along the second direction, the first bending part adapted for restricting the movement of the interface card module along the second direction and the second bending part adapted for restricting the movement of the interface card module along a third direction.

12. An electronic device, comprising:
a housing;
an interface card module, comprising:
  a support frame comprising two first holes, the support frame adapted for being mounted on the housing;
  a riser card mounted on the support frame and comprising a slot; and
  two module locks moveably mounted on positions of the support frame corresponding to the two first holes, the two module locks adapted for being withstood by the housing for engaging the support frame on the housing and installing the interface card module on the housing, the two module locks operatable through the two first holes so as to move relative to the support frame to disengage from the withstanding of the housing; and
an interface card adapted to be installed into the slot of the riser card.

13. The electronic device of claim 12, wherein the interface card module further comprises a card lock mounted on the support frame and pivotable to a locking position or a release position with respect to the support frame.

14. The electronic device of claim 13, wherein the card lock comprises a fastening groove in which the interface card extends and is retained therein when the card lock is pivoted to the locking position with respect to the support frame.

15. The electronic device of claim 14, wherein the card lock comprises an elastic hook and the support frame comprises an opening at a pivot route of the card lock and wherein the elastic hook is adapted to engage with the opening for restraining pivoting of the card lock as the card lock is pivoted to the locking position with respect to the support frame.

16. The electronic device of claim 13, wherein the support frame comprises a wall located at a pivot route of the card lock on the support frame and adapted for retaining the card lock at the release position.

17. The electronic device of claim 12, wherein each module lock comprises a lock body comprising a second hole corresponding to the first hole of the support frame.

18. The electronic device of claim 17, wherein the lock body further comprises a guiding rod, each module lock further comprising an elastic element disposed between the guiding rod of the lock body and the support frame and adapted to be compressed by the lock body and have a restoring force when the module lock moves relative to the support frame.

19. The electronic device of claim 17, wherein the lock body further comprises an engaging part and the housing of the electronic device comprises a protrusion adapted for pushing the engaging part and moving the module lock relative to the support frame.

20. The electronic device of claim 12, wherein the interface card module is adapted to be installed on the housing along a first direction and the two module locks are adapted to be pushed to move toward a second direction by the housing and withstood by the housing when the interface card module is installed on the housing such that the movement of the interface card module along the first direction is restricted.

21. The electronic device of claim 20, wherein the lock body further comprises an engaging part and the housing comprises a protrusion adapted for pushing the engaging part and moving the module lock relative to the support frame along the second direction, and when the interface card module is installed on the housing, the protrusion withstand the engaging part such that the movement of the interface card module along the first direction is restricted.

22. The electronic device of claim 20, wherein the support frame further comprises a first bending part and a second bending part, the housing further comprises a restraining slot corresponding to the second bending part, and when the interface card module is installed on housing, the first bending part extends along the first direction and the second bending part extends into the restraining slot along the second direction, the first bending part adapted for restricting the movement of the interface card module along the second direction and the second bending part adapted for restricting the movement of the interface card module along a third direction.

* * * * *